United States Patent
Saito et al.

(10) Patent No.: US 9,219,142 B2
(45) Date of Patent: Dec. 22, 2015

(54) SEMICONDUCTOR DEVICE HAVING ELEMENT REGION AND TERMINATION REGION SURROUNDING ELEMENT REGION

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Jun Saito, Nagoya (JP); Sachiko Aoi, Nagoya (JP); Yukihiko Watanabe, Nagoya (JP); Toshimasa Yamamoto, Ichinomiya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 14/491,332

(22) Filed: Sep. 19, 2014

(65) Prior Publication Data
US 2015/0084124 A1 Mar. 26, 2015

(30) Foreign Application Priority Data
Sep. 24, 2013 (JP) .................................. 2013-197410

(51) Int. Cl.
 *H01L 29/78* (2006.01)
 *H01L 29/423* (2006.01)
(52) U.S. Cl.
 CPC ........ *H01L 29/7811* (2013.01); *H01L 29/4236* (2013.01); *H01L 29/7813* (2013.01)
(58) Field of Classification Search
 CPC ............ H01L 29/7811; H01L 29/4236; H01L 29/7813; H01L 29/782

USPC ......................................................... 257/471
See application file for complete search history.

(56) References Cited

U.S. PATENT DOCUMENTS

2007/0096172 A1* 5/2007 Tihanyi et al. ................ 257/288
2008/0185643 A1* 8/2008 Hossain ........................ 257/342

(Continued)

FOREIGN PATENT DOCUMENTS

JP  A-2008-135522  6/2008
JP  A-2009-59860   3/2009
KR  2008-0106336 A  12/2008

OTHER PUBLICATIONS

International Application No. PCT/IB2014/001887 filed Sep. 22, 2014.

*Primary Examiner* — Nathan Ha
(74) *Attorney, Agent, or Firm* — Oliff PLC (57) ABSTRACT

A semiconductor device includes a semiconductor substrate having an element region and a termination region. The element region includes a first body region having a first conductivity type, a first drift region having a second conductivity type, and first floating regions having the first conductivity type. The termination region includes FLR regions, a second drift region and second floating regions. The FLR regions have the first conductivity type and surrounds the element region. The second drift region has the second conductivity type, makes contact with and surrounds the FLR regions. The second floating regions have the first conductivity type and is surrounded by the second drift region. The second floating regions surround the element region. At least one of the second floating regions is placed at an element region side relative to the closest one of the FLR regions to the element region.

12 Claims, 3 Drawing Sheets

(56) References Cited

U.S. PATENT DOCUMENTS

| | | |
|---|---|---|
| 2009/0057757 A1 | 3/2009 | Hokomoto et al. |
| 2010/0140695 A1* | 6/2010 | Yedinak et al. ............... 257/334 |
| 2010/0224932 A1 | 9/2010 | Takaya et al. |
| 2012/0217541 A1* | 8/2012 | Hsieh ........................... 257/140 |
| 2012/0273875 A1* | 11/2012 | Yedinak et al. ............... 257/330 |
| 2012/0273884 A1* | 11/2012 | Yedinak et al. ............... 257/341 |
| 2012/0273916 A1* | 11/2012 | Yedinak et al. ............... 257/471 |
| 2012/0276701 A1* | 11/2012 | Yedinak et al. ............... 438/270 |
| 2012/0326207 A1* | 12/2012 | Yoshimochi .................. 257/139 |
| 2013/0277740 A1* | 10/2013 | Guan et al. .................... 257/342 |
| 2014/0001552 A1* | 1/2014 | Hirler et al. ................... 257/339 |

* cited by examiner

SEMICONDUCTOR DEVICE HAVING ELEMENT REGION AND TERMINATION REGION SURROUNDING ELEMENT REGION

INCORPORATION BY REFERENCE

The disclosure of Japanese Patent Application No. 2013-197410 filed on Sep. 24, 2013 including the specification, drawings and abstract is incorporated herein by reference in its entirety.

BACKGROUND OF THE INVENTION

1. Field of the Invention

The present invention relates to a semiconductor device.

2. Description of Related Art

Japanese Patent Application Publication No. 2008-135522 (JP 2008-135522 A) describes a semiconductor device in which an element region and a termination region are formed in a semiconductor substrate. In the element region, a plurality of linear trench gate electrodes is formed, and in the termination region, a plurality of termination trenches provided around the plurality of trench gate electrodes is formed. P-type floating regions are formed on bottom faces of the termination trenches. The floating regions are surrounded by an n-type drift region. The semiconductor device is configured such that a distance between floating regions adjacent to each other is optimized so as to improve uniformity of breakdown voltage in the termination region.

In recent years, development of a semiconductor device with low loss has been desired. As one approach to attain low loss of a semiconductor device, an on-resistance may be reduced. In order to reduce the on-resistance, it is conceivable that an impurity concentration in a drift region is increased. However, if the impurity concentration of the drift region is increased, respective breakdown voltages in an element region and in a termination region might be decreased. When the breakdown voltage of the termination region becomes the breakdown voltage of the element region or less, avalanche breakdown occurs in the termination region. Generally, the termination region has a smaller area than the element region. Therefore, if a breakdown current flows through the termination region, a temperature of the termination region easily becomes high, which is unfavorable. Accordingly, there is such a demand that the breakdown voltage of the termination region is set higher than the breakdown voltage of the element region so that avalanche breakdown occurs in the element region.

SUMMARY OF THE INVENTION

The present invention provides a semiconductor device that is able to maintain a breakdown voltage in a termination region even when an impurity concentration of a drift region is relatively high.

A semiconductor device according to an aspect of the present invention includes a semiconductor substrate. The semiconductor substrate has an element region and a termination region surrounding the element region. The element region includes a first body region, a first drift region and a plurality of first floating regions. The first body region has a first conductivity type and is placed in a range facing a top face of the semiconductor substrate. The first drift region has a second conductivity type and makes contact with a bottom face of the first body region. The first floating regions have the first conductivity type and are surrounded by the first drift region. The termination region includes a plurality of field limiting ring regions, a second drift region and a plurality of second floating regions. The field limiting ring regions have the first conductivity type, are placed in a range facing the top face of the semiconductor substrate and surround an outer periphery of the element region. The second drift region has the second conductivity type, makes contact with the field limiting ring regions and surrounds the field limiting ring regions. The second floating regions have the first conductivity type and are surrounded by the second drift region. The second floating regions surround the outer periphery of the element region. At least one of the second floating regions is placed at an element region side relative to an inner peripheral side surface of one of the field limiting ring regions, the one of the field limiting ring regions being the closest of the field limiting ring regions to the element region.

In the above semiconductor device, the plurality of the field limiting ring regions (FLR regions) and the plurality of the second floating regions are formed in the termination region. The FLR regions are formed in a range facing the top surface of the semiconductor substrate. The second floating region is formed inside the semiconductor substrate. When a reverse bias voltage is applied to the semiconductor device, depletion layers expand from a junction surface between the FLR region and the second drift region and a junction surface between the second floating region and the second drift region. This makes it possible to control an electric field distribution of the termination region by two layers of the FLR regions and the second floating regions. This accordingly makes it possible to place equipotential lines evenly from the inside of the semiconductor substrate to the top face thereof, thereby making it possible to reduce intensities of electric fields inside the semiconductor substrate and on the top face of the semiconductor substrate. As a result, it is possible to improve a breakdown voltage of the termination region. Further, generally, the electric field easily concentrates in a range (hereinafter referred to as a boundary region) from a boundary between the element region and the termination region, to that part of a termination structure which is closest to the element region, so that the intensity of the electric field easily increases in this range. In the above semiconductor device, at least one of the second floating regions is placed at an element-region side (that is, the boundary region) relative to an inner peripheral side surface of the FLR region closest to the element region. This makes it possible to suppress the concentration of the electric field in the boundary region and to reduce the intensity of the electric field of the boundary region. According to the above configuration, it is possible to attain a relatively high breakdown voltage of the termination region as compared with a breakdown voltage of the element region, and even in a case where an impurity concentration of the drift region is relatively high, it is still possible to maintain the breakdown voltage in the termination region.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

The following describes main features of an embodiment of the present invention. Note that technical elements described below are technical elements independent from each other, and exhibit a technical usability solely or in various combinations.

In the embodiment of the present invention, the termination region may further include a second body region. The second body region has the first conductivity type, is placed in a range facing the top face of the semiconductor substrate, is partially disposed at an element-region side, and is continuously formed from the first body region. The FLR regions may be arranged apart from the second body region. The second drift region may make contact with a bottom face and side faces of the second body region. The second drift region may be configured to separate the second body region from the FLR regions. When the semiconductor substrate is viewed in a plane manner, the second floating regions may include at least one lower second floating region, the lower second floating region including an overlapping portion with the second body region.

In the above configuration, the second body region is formed in a boundary region. In view of this, in comparison with a configuration in which the second body region is not formed in the boundary region, it is possible to retrain a decrease in breakdown voltage in the boundary region. Further, according to the above configuration, when the semiconductor substrate is viewed in a plane manner, at least one of the plurality of second floating regions is the lower second floating region including an overlapping portion with the second body region. Hereby, in an area where the lower second floating region is formed, an electric field in a thickness direction of the semiconductor substrate can be shared by two regions, i.e., the second body region and the lower second floating region. This makes it possible to further reduce intensity of the electric field in the boundary region.

In the embodiment of the present invention, the second floating regions may include a plurality of the lower second floating regions. The first floating regions may be placed at a predetermined interval from an element-region side toward a termination-region side in a predetermined depth in a thickness direction of the semiconductor substrate. The lower second floating regions may be placed in the predetermined depth. An interval b0 between an outermost lower second floating region of the lower second floating regions and the closest one of the second floating regions to the outermost lower second floating region may be a half or less of the predetermined interval. The closest one of the second floating regions is arranged outside the outermost lower second floating region in a surface direction of the semiconductor device.

When a reverse bias voltage is applied to the semiconductor device, respective depletion layers expand from a pn junction between the first body region and the first drift region and from a pn junction between the second body region and the second drift region. According to the above configuration, the respective depletion layers reach the first floating region and the lower second floating region generally at the same timing. Further, before respective depletion layers expanding from the first floating regions placed at the predetermined interval are connected to each other, a depletion layer expanding from the outermost lower second floating region reaches a second floating region placed at its outer peripheral side. This makes it possible to maintain a breakdown voltage of the termination region preferentially. In the above configuration, the plurality of the lower second floating regions may be replaced with one lower second floating region.

In the embodiment of the present invention, n pieces of the FLR regions may be formed and m pieces of the second floating regions may be formed excluding the lower second floating regions. In this case, n and m are natural numbers. Furthermore, a following relationship (I) may be established: $c0<b0$, $ci<bj$ (I). In this case i is at least 1 and at most n−1, j is at least 1 and at most m−1, i is equal to j in the relationship (I), and an upper limit of i is a smaller one of n−1 and m−1 in the relationship (I). Furthermore, $ci$ indicates an interval between an i-th FLR region and an (i+1)-th FLR region from inside toward outside in the surface direction. Furthermore, c0 indicates an interval between a first FLR region from inside in the surface direction and the second body region. Furthermore, $bj$ indicates an interval between a j-th second floating region and a (j+1)-th second floating region when the m pieces of the second floating regions are counted from inside toward outside in the surface direction.

According to the above configuration, depletion between the FLR regions proceeds faster than depletion between the second floating regions. This makes it possible to attain a relatively high breakdown voltage on a top face of the semiconductor substrate as compared with a breakdown voltage inside the semiconductor substrate, in the termination region. In other words, the breakdown voltage of the termination region is determined by a termination structure (that is, the second floating regions) inside the semiconductor substrate. Accordingly, even if an electric field on the top face of the semiconductor substrate is disturbed by external charge, it is possible to restrain the breakdown voltage of the termination region from decreasing due to the disturbance of the electric field on the top face. This attains a semiconductor device that is hard to be affected by external charge. In the above configuration, the plurality of the lower second floating regions may be replaced with one lower second floating region.

In the embodiment of the present invention, the number of the FLR regions may be larger than the number of the second floating regions excluding the lower second floating regions. According to the above configuration, it is possible to attain a relatively high breakdown voltage on the top face of the semiconductor substrate as compared with the breakdown voltage inside the semiconductor substrate, in the termination region. In the above configuration, the plurality of the lower second floating regions may be replaced with one lower second floating region.

In the embodiment of the present invention, a thickness of the FLR region in a thickness direction of the semiconductor substrate may be larger than a thickness of the second floating region in the thickness direction. According to the configuration, a length of a side surface of the FLR region in the thickness direction of the semiconductor substrate is long. Accordingly, a depletion layer is easy to expand from a side surface of the FLR region, thereby making it possible to suppress an electric field from concentrating on the side surface of the FLR region. This makes it possible to attain a relatively high breakdown voltage on the top face of the semiconductor substrate as compared with the breakdown voltage inside the semiconductor substrate, in the termination region.

In the embodiment of the present invention, when the semiconductor substrate is viewed in a plane manner, the termination region may be formed between at least one side of the element region and an end side of the semiconductor substrate. A width of the FLR region in a specific direction from the element region toward the end side of the semiconductor substrate may be larger than a width of the second floating region in the specific direction, between the at least one side of the element region and the end side of the semiconductor substrate. According to the above configuration, the depletion layer more easily expands from the FLR region than from the second floating region. This makes it possible to further suppress the electric field from concentrating in a vicinal area of the FLR region.

In the embodiment of the present invention, the element region may include a gate electrode and an insulator. The gate electrode may be placed inside a gate trench and may be opposed to the first body region. The gate trench may penetrate through the first body region and may extend to the first drift region. The insulator may be placed between the gate electrode and an inner wall of the gate trench. The first floating region in the element region may surround a bottom portion of the gate trench.

In the embodiment of the present invention, the termination region may include a dummy trench and an insulator. The dummy trench may penetrate through the second body region and may extend in the second drift region. The insulator may be placed in the dummy trench. The dummy trench may surround the outer periphery of the element region. At least one of the second floating regions may surround a bottom portion of the dummy trench. According to the configuration, it is possible to further improve the breakdown voltage of the termination region by forming the dummy trench.

Figure 1:
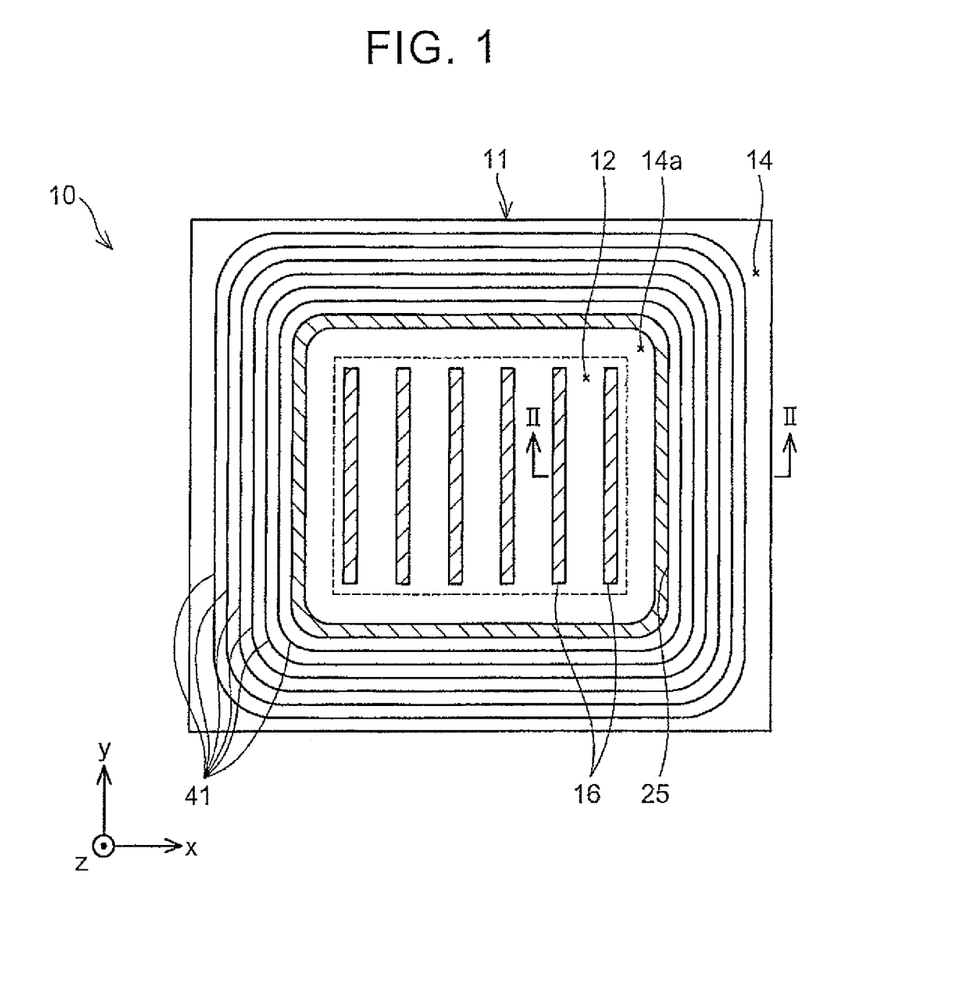
FIG. 1 is a plane view of a semiconductor device according to Embodiment 1 of the present invention.
Figure 2:
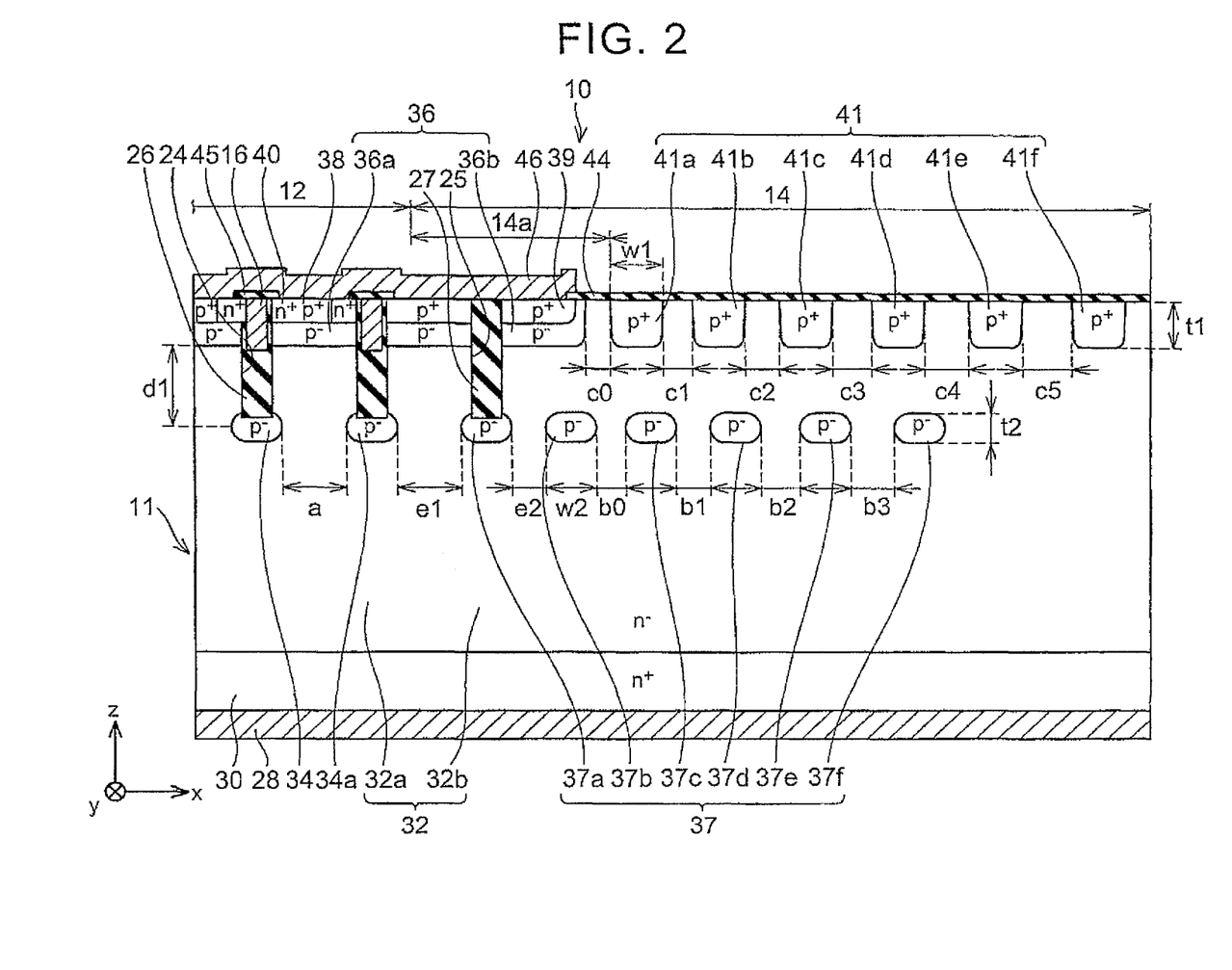
FIG. 2 is a drawing of a longitudinal section of the semiconductor device according to Embodiment 1 of the present invention.

The following describes a semiconductor device 10 of Embodiment 1 with reference to FIGS. 1, 2. In FIG. 1, an insulator film and an electrode on a semiconductor substrate 11 are not illustrated so as to facilitate viewing of the figure. Further, in FIGS. 1, 2, a contraction scale is changed so as to facilitate viewing of the figures. Because of this, it should be noted that the contraction scale of FIG. 1 is not the same as that of FIG. 2. Further, gate electrodes 16 and a dummy trench 25 to be described below are illustrated with hatches in FIG. 1. As illustrated in FIG. 1, the semiconductor device 10 is formed in the semiconductor substrate 11. An element region 12 and a termination region 14 are formed in the semiconductor substrate 11. When the semiconductor substrate 11 is viewed in a plane manner, the element region 12 has a generally rectangular shape. The termination region 14 surrounds the element region 12. In other words, the termination region 14 is formed between four sides constituting the element region 12 and end sides of the semiconductor substrate 11. In the following description, in the termination region 14, a region closer to the element region 12 than an inner peripheral side surface of an FLR region 41a to be described later is particularly referred to as a boundary region 14a. A SiC substrate is used as the semiconductor substrate 11.

Six gate electrodes 16 are formed in the element region 12. The six gate electrodes 16 extend in a y-direction in FIG. 1, and are arranged in an x-direction in FIG. 1 at a predetermined interval. One dummy trench 25 and six FLR regions 41 are formed in the termination region 14. The dummy trench 25 is provided so as to surround the element region 12, and the six FLR regions 41 are provided so as to surround the dummy trench 25.

Here, a configuration of the element region 12 is described. As illustrated in FIG. 2, an insulated-gate semiconductor element is formed in the element region 12. That is, that part of the element region 12 which faces a top face of the semiconductor substrate 11, an n+ type source region 40 and a p+ type body contact region 38 are formed. The body contact region 38 is formed so as to make contact with the source region 40.

A p- type body region 36a is formed below the source region 40 and the body contact region 38. An impurity concentration of the body region 36a is set lower than an impurity concentration of the body contact region 38. The body region 36a makes contact with the source region 40 and the body contact region 38. Accordingly, the source region 40 is surrounded by the body region 36a and the body contact region 38. The body region is formed even in part of the termination region 14. In the following description, a p- type body region formed in the termination region 14 is referred to as a "body region Mb," and the body region 36a and the body region 36b are generally referred to as a "body region 36." The body region 36a and the body region 36b constitutes a continuous region, and are formed integrally. In view of this, a bottom face of the body region 36a and a bottom face of the body region 36b are placed at the same height in a z-direction. Note that the p- type body region 36a and the body contact region 38 may be considered as the first body region of the present invention. The body region 36b and a body contact region 39 (described later) may be considered as the second body region of the present invention.

An n- type drift region 32a is formed below the body region 36a. The drift region is formed in an entire surface of the semiconductor substrate 11. In the following description, an n- type drift region formed in the termination region 14 is referred to as a "drift region 32b," and the drift region 32a and the drift region 32b are generally referred to as a "drift region 32." The drift region 32a and the drift region 32b constitutes a continuous region, and are formed integrally. The drift region 32a makes contact with a bottom face of the body region 36a. The drift region 32a is separated from a source region 40 by the body region 36a. In the drift region 32a, p- type diffusion regions 34 are formed in a range surrounding bottom portions of the after-mentioned gate trenches 24. The diffusion regions 34 make contact with respective insulators 26 (that is, the bottom portions of the gate trenches 24) in lower parts of the gate electrodes 16. The diffusion regions 34 are surrounded by the drift region 32a. Hereby, the diffusion regions 34 are separated from the body region 36a. The diffusion regions 34 are formed at an interval a in a position of a depth d1 from a bottom face of the body region 36a. Note that the n- type drift region 32a may be considered as the first drift region of the present invention. The drift region 32b may be considered as the second drift region of the present invention. The diffusion region 34 may be considered as the first floating region of the present invention.

An n+ type drain region 30 is formed in a range facing a bottom face of the semiconductor substrate 11. The drain region 30 is formed in an entire surface of the semiconductor substrate 11. An impurity concentration of the drain region 30 is set higher than an impurity concentration of the drift region 32. The drain region 30 makes contact with a bottom face of the drift region 32. The drain region 30 is separated from the body region 36 by the drift region 32.

The gate trenches 24 are formed on the top face of the semiconductor substrate 11. The gate trenches 24 penetrate through the source region 40 and the body region 36a, and bottom ends thereof extend in the drift region 32a. In the gate trenches 24, the gate electrodes 16 are formed. The gate electrodes 16 are each formed, so that its bottom end is slightly deeper than the bottom face of the body region 36a. An insulator 26 is filled in between a wall surface of the gate trench 24 and the gate electrode 16 (that is, lateral sides and a lower side of the gate electrode 16). Because of this, the gate electrode 16 is opposed to the body region 36a and the source region 40 via the insulator 26. Further, a cap insulator film 45 is formed on a top face of the gate electrode 16.

A drain electrode 28 is formed on the bottom face of the semiconductor substrate 11. The drain electrode 28 is formed on an entire surface of the semiconductor substrate 11. The drain electrode 28 makes Ohmic contact with the drain region 30. A source electrode 46 is formed on the top surface of the semiconductor substrate 11. The source electrode 46 is formed in the element region 12 and in part of the termination region 14. In the element region 12, the source electrode 46 makes Ohmic contact with the source region 40 and the body contact region 38. In the termination region 14, the source electrode 46 makes Ohmic contact with the body contact region 39. The source electrode 46 is insulated from the gate electrode 16 by the cap insulator film 45.

The following describes the termination region 14. As illustrated in FIG. 2, one dummy trench 25, six FLR regions 41, and six diffusion regions 37 are formed in the termination region 14. In part of the termination region 14, the body contact region 39 is formed in a range facing the top surface of the semiconductor substrate 11. The body region 36b is formed below the body contact region 39. The body region 36b makes contact with a bottom face and side faces of the body contact region 39. The drift region 32b is formed below the body region 36b. The drift region 32b makes contact with a bottom face and side faces of the body region 36b. The dummy trench 25 penetrates through the body contact region 39 and the body region 36b, so that a bottom end thereof extends in the drift region 32b. The bottom end of the dummy trench 25 is placed at the same depth as a bottom end of the gate trench 24. The dummy trench 25 is filled with an insulator 27.

In the termination region 14, six p− type diffusion regions 37 are formed in the drift region 32b. In the following description, the respective diffusion regions 37 are referred to as a diffusion region 37a, a diffusion region 37b, ..., a diffusion region 37f sequentially toward the x-direction. The diffusion regions 37a to 37f have generally the same size. The diffusion regions 37 are each formed such that a width thereof in a direction (the x-direction in FIG. 2) from the element region 12 toward an end side of the semiconductor substrate 11 is w2, and a thickness thereof in a thickness direction (the z-direction of FIG. 2) of the semiconductor substrate 11 is t2. The diffusion region 37a among the diffusion regions 37 is formed in a range surrounding a bottom portion of the dummy trench 25. The diffusion regions 37 are surrounded by the drift region 32b. In the present embodiment, the diffusion regions 37a to 37f are formed in a depth that is generally the same depth as the diffusion regions 34 (that is, the depth d1), and surround an outer periphery of the element region 12. Note that the diffusion regions 37 may be considered as the second floating regions of the present invention.

The diffusion regions 37a, 37b among the diffusion regions 37 are placed in the boundary region 14a of the termination region 14. More specifically, the diffusion regions 37a, 37b are placed below the body region 36b. In other words, when the semiconductor substrate 11 is viewed in a plane manner, the diffusion regions 37a, 37b overlap the body region 36b. Accordingly, in the present embodiment, two diffusion regions 37a, 37b out of six diffusion regions 37 are placed below the body region 36b, and four diffusion regions 37c to 37f are placed on an outer peripheral side of the body region 36b. Note that the diffusion regions 37a, 37b may be considered as the lower second floating region of the present invention.

Here, when an interval between the diffusion region 37b and the diffusion region 37c is assumed b0, and an interval between a j-th (j=1 to 3) diffusion region 37 from the diffusion region 37b toward the outer peripheral side and a (j+1)-th diffusion region 37 is assumed bj, a relationship of $b0 < bj < bj+1$ is established for b0, bj, bj+1. Further, as described above, adjacent diffusion regions 34 are evenly placed at the interval a. A relationship of $2 \times b0 \leq a$ is established between the interval a and the interval b0.

Further, the diffusion region 37a is formed at an interval e1 from that diffusion region 34 in the element region 12 which is formed closest to the termination region 14 (hereinafter referred to as an end-side diffusion region 34a). In the present embodiment, it is assumed that e1=a, but this is not only option, and it may be assumed that e1<a. Further, the diffusion region 37b is formed at an interval e2 from the diffusion region 37a. In the present embodiment, it is assumed that e2<a, but this is not only option, and it may be assumed that e2=a.

Next will be described the FLR regions 41. As described above, in the termination region 14, six p+ type FLR regions 41 are formed in a range facing the top surface of the semiconductor substrate 11. An impurity concentration of the FLR region 41 is set higher than an impurity concentration of the body region 36b. In the following description, the respective FLR regions 41 are referred to as an FLR region 41a, an FLR region 41b, ..., an FLR region 41f sequentially toward the x-direction. The FLR region 41a to the FLR region 41f have generally the same size. The FLR regions 41 are each formed such that a width thereof in a direction from the element region 12 toward an end side of the semiconductor substrate 11 is w1, and a thickness thereof in a thickness direction of the semiconductor substrate 11 is t1. The drift region 32b makes contact with the FLR regions 41 and surrounds the FLR regions 41. The FLR region 41a is formed at an interval c0 from the body region 36b. Here, the interval c0 strictly indicates an interval between that side surface of the body region 36b which is opposite to the element region 12 (an x-direction side) and that side surface of the FLR region 41a which is closer to the element region 12 (an −x-direction side). The drift region 32b is placed between the body region 36b and the FLR region 41a. In other words, the drift region 32b separates the body region 36b from the FLR region 41a. As is apparent from FIG. 2, two diffusion regions 37a, 37b are placed closer to the element region 12 than an inner peripheral side surface of the FLR region 41a.

Here, when an interval between an i-th (i=1 to 5) FLR region 41 from an inner peripheral side toward an outer peripheral side and an (i+1)-th FLR region 41 is assumed ci, a relationship of $c0 < ci < ci+1$ is established for c0, ci, ci+1.

Further, relationships of $c0 < b0$, $c1 < b1$, $c2 < b2$, $c3 < b3$ are established between the intervals 130 to b3 and the intervals c0 to c3. Further, a relationship of $w1 > w2$ is established between the width w1 of the FLR region 41 and the width w2 of the diffusion region 37, and a relationship of $t1 > t2$ is established between the thickness t1 of the FLR region 41 and the thickness t2 of the diffusion region 37.

Further, as described above, six FLR regions 41 are formed. In the meantime, four diffusion regions among the diffusion regions 37 are formed so as not to be placed below the body region 36b. That is, the number of FLR regions 41 is larger than the number of diffusion regions 37 (that is, the diffusion regions 37c to 37f) that are not placed below the body region 36b.

An insulator film 44 is formed on the top surface of the semiconductor substrate 11 in the termination region 14. The insulator film 44 covers part of a top face of the body contact region 39, part of a top face of the body region 36b, and a top face of the drift region 32b.

When the semiconductor device 10 is used, the drain electrode 28 is connected to a power supply potential, and the source electrode 46 is connected to a ground potential. When an electric potential applied to the gate electrodes 16 is less than a threshold electric potential, the semiconductor device 10 is turned off. In a state where the semiconductor device 10 is turned off, a depletion layer expands from a pn junction between the body region 36 and the drift region 32. When the depletion layer expanding from the pn junction reaches the FLR region 41a, a depletion layer expands from a pn junction between the FLR region 41a and the drift region 32b. Similarly, when the depletion layer expanding from the pa junction (the pn junction between the body region 36 and the drift region 32) reaches the diffusion regions 34, 37a, 37b, respective depletion layers expand from respective pn junctions between the diffusion regions 34 and the drift region 32a, and respective pn junctions between the diffusion regions 37a, 37b and the drift region 32b.

When the electric potential applied to the gate electrodes 16 is the threshold electric potential or more, the semiconductor device 10 is turned on. When the semiconductor device 10 is turned on, a channel is formed in that part of the body region 36a which makes contact with the insulator 26. Hereby, electrons flow from the source electrode 46 to the drain electrode 28 through the source region 40, the channel of the body region 36a, the drift region 32a, and the drain region 30. That is, a current flows from the drain electrode 28 to the source electrode 46.

Next will be described advantages of the semiconductor device 10 of Embodiment 1. As illustrated in FIG. 2, the diffusion regions 37 and the FLR regions 41 are formed in the termination region 14 of the semiconductor device 10. The diffusion regions 37 are formed inside the semiconductor substrate 11 (more specifically, in a position of the depth d1 from the bottom face of the body region 36), and the FLR regions 41 are formed in a range facing the top surface of the semiconductor substrate 11. Hereby, when a reverse bias voltage is applied to the semiconductor device 10, equipotential lines are placed evenly between adjacent diffusion regions 37 and between adjacent FLR regions 41. In view of this, in the termination region 14, it is possible to restrain concentration of the electric field inside the semiconductor substrate 11, and it is also possible to restrain concentration of the electric field on the top face thereof. Accordingly, an electric field intensity does not locally increase in the termination region 14, thereby making it possible to decrease the electric field intensity in the whole termination region 14. This consequently makes it possible to improve a breakdown voltage of the termination region 14, and to reduce an area of the termination region 14. Further, generally, in a region corresponding to the boundary region 14a, the electric field is concentrated thereon so that the electric field intensity easily becomes higher and a breakdown voltage thereof easily decreases. In the present embodiment, the diffusion regions 37a, 37b are placed in the boundary region 14a. This makes it possible to restrain the electric field intensity in boundary region 14a to the electric field intensity of the element region 12 or less. Thus, a plurality of FLR regions 41 and a plurality of diffusion regions 37 are formed in the termination region 14 such that some diffusion regions 37 are placed in the boundary region 14a, thereby making it possible to attain a relatively high breakdown voltage of the termination region 14 as compared with the breakdown voltage of the element region 12. Accordingly, even in a case where the impurity concentration of the drift region 32 is relatively high, it is possible to maintain the breakdown voltage in the termination region 14. As a result, a region where avalanche breakdown occurs can be the element region 12. Since the element region 12 has an area relatively larger than the termination region 14, a temperature thereof is hard to increase, so that the element region 12 can tolerate a large breakdown current. This makes it possible to increase an avalanche resistance of the semiconductor device 10.

Further, in the present embodiment, the body region 36b is also formed in part (that is, the boundary region 14a) of the termination region 14. The body region 36b extends toward the end side (in the x-direction) of the semiconductor substrate 11 from the dummy trench 25. Since the electric field is easy to concentrate on the trench, when the body region 36b is formed as described above, it is possible to restrain the electric field from concentrating on the dummy trench 25. In a case where the dummy trench 25 is not formed, it is possible to restrain the electric field from concentrating on the gate trench 24 placed closest to the termination region 14. Further, in the present embodiment, the diffusion regions 37a, 37b are placed below the body region 36b. Generally, when a reverse bias voltage is applied to the semiconductor device 10, the electric field concentrates on the pa junction between the body region 36b and the drift region 32b, and the breakdown voltage of the pn junction is easy to decrease. However, by placing the diffusion regions 37a, 37b as such, it is possible to suppress the concentration of the electric field on the pn junction and to restrain a decrease in the breakdown voltage.

Further, in the present embodiment, six diffusion regions 34 are placed at the interval a in the same depth d1. Further, two diffusion regions 37a, 37b are also placed in the same depth d1 as the diffusion regions 34. When a reverse bias voltage is applied, a depletion layer expands from the pn junction between the body region 36 and the drift region 32. By placing the diffusion regions 37a, 37b in the same depth, the depletion layer reaches the diffusion regions 34, 37a, 37b at about the same timing. When the depletion layer reaches the diffusion regions 34, 37a, 37b, respective depletion layers expand from the pn junctions between the diffusion regions 34 and the drift region 32a, and from the pn junctions between the diffusion regions 37a, 37b and the drift region 32b. The depletion layers generally expand from the diffusion regions 34 and from the diffusion regions 37a, 37b generally at the same speed. Since the six diffusion regions 34 are placed at regular intervals, respective depletion layers expanding from adjacent diffusion regions 34 are connected to each other generally at the same time among the diffusion regions 34. This timing is assumed a first timing. The depletion layers are connected to each other in a general center between the adjacent diffusion regions 34. Meanwhile, the depletion layer expanding from the diffusion region 37b (that is, an outer peripheral side diffusion region 37 in the diffusion regions 37a, 37b) reaches the diffusion region 37c adjacent to the diffusion region 37b on its outer peripheral side. This timing is assumed a second timing. In the present embodiment, the interval b0 between the diffusion region 37b and the diffusion region 37c is set to a half or less of the interval a between the adjacent diffusion regions 34. Accordingly, the second timing comes earlier than the first timing. That is, depletion between the diffusion region 37b and the diffusion region 37c precedes depletion between the adjacent diffusion regions 34. This makes it possible to maintain the breakdown voltage of the termination region 14 preferentially, and to attain a relatively high breakdown voltage of the termination region 14 as compared with the breakdown voltage of the element region 12. Further, in the present embodiment, the interval e1 between the end-side diffusion region 34a and the diffusion region 37a is the same as the interval a, depletion between the end-side diffusion region 34a and the diffusion region 37a proceeds almost at the same time as the depletion between the adjacent diffusion regions 34. Further, since the interval e2 between the diffusion region 37a and the diffusion region 37b is set shorter than the interval a, depletion between the diffusion region 37a and the diffusion region 37b precedes the depletion between the adjacent diffusion regions 34. This makes it possible to maintain the breakdown voltage of the termination region 14 more appropriately.

When the depletion layer reaches the diffusion region 37a, a depletion layer expands from the diffusion region 37a and reaches the diffusion region 37b. Then, a depletion layer expands from the diffusion region 37b and reaches the diffusion region 37c. The depletion layer expands to the diffusion region 37f in this way. Further, a depletion layer expanding from a pn junction between the side surface of the body region 36b and the drift region 32b reaches the FLR region 41a. When the depletion layer reaches the FLR region 41a, a depletion layer expands from the FLR region 41a and reaches the FLR region 41b. Then, a depletion layer expands from the FLR region 41b and reaches the FLR region 41c. The depletion layer expands to the FLR region 41l in this way. In the present embodiment, the relationships of $c0<b0$, $c1<b1$, $c2<b2$, $c3<b3$ are established between the intervals b0 to b3 and the intervals c0 to c3. Generally a depletion layer is hard to expand from the side surface of the body region. However, when the relationship of $c0<b0$ is established, the depletion layer expanding from the side surface of the body region 36b is easy to reach the FLR region 41a before a depletion layer expanding from the bottom face of the body region 36b reaches the diffusion region 37c via the diffusion region 37b. Further, when the relationship of $c1<b1$ is established, the depletion layer is easy to reach the FLR region 41b before the depletion layer reaches the diffusion region 37d. Similarly, when the relationships of $c2<b2$ and $c3<b3$ are established, the depletion layer is easy to reach the FLR region 41d before the depletion layer reaches the diffusion region 37f. Because of this, depletion between the FLR region 41a and 41d easily precedes depletion between the diffusion regions 37b to 37f. Accordingly, in the termination region 14, it is possible to set the breakdown voltage on the top face of the semiconductor substrate 11 (that is, a breakdown voltage in a range where the FLR regions 41 are formed) to be higher than the breakdown voltage inside the semiconductor substrate 11 (that is, a breakdown voltage in a range where the diffusion regions 37 are formed). In other words, a value of the breakdown voltage of the diffusion regions 37 is a value of the breakdown voltage of the termination region 14. As a result, even if the electric field on the top face of the semiconductor substrate 11 is disturbed by external charge and the electric field intensity of the top face decreases slightly, it is possible to restrain the breakdown voltage of the termination region 14 from decreasing due to attachment of the external charge, unless the electric field intensity becomes less than the electric field intensity of the diffusion regions 37 and its vicinal area. That is, it is possible to attain a terminal structure which is hard to be affected by external charge and which has a small decrease in breakdown voltage.

Generally, as the interval b between adjacent diffusion region 37 is shorter and shorter, a depletion layer expanding from one of the adjacent diffusion regions 37 reaches the other one of the adjacent diffusion regions 37 earlier. However, a retentive power of the breakdown voltage by these diffusion regions 37 decreases. In the meantime, as the interval b is longer and longer, the depletion layer expanding from one of the adjacent diffusion regions 37 reaches the other one of the adjacent diffusion regions 37 slower. However, the retentive power of the breakdown voltage by these diffusion regions 37 increases. In the present embodiment, the intervals b0 to b3 between the adjacent diffusion regions 37b to 37f are set to be $b0<b1<b2<b3$. Accordingly, the depletion layer expanding from the diffusion region 37b expands immediately to the diffusion regions 37c to 37f. Accordingly, the depletion between the diffusion regions 37b to 37f proceeds faster in comparison with a configuration of $b0>b1>b2>b3$, for example. At the same time, it is possible to yield a high retentive power of the breakdown voltage in outer-peripheral side diffusion regions 37 (e.g., the diffusion regions 37d to 37f) provided at the intervals b that are relatively wide. In view of this, in comparison with a configuration of $b0=b1=b2=b3$, for example, it is possible to improve the retention power of the breakdown voltage by the diffusion regions 37.

Further, in the present embodiment, the number (six) of FLR regions 41 is larger than the number (four) of diffusion regions 37, among the diffusion regions 37, formed so as not to be placed below the body region 36b. Generally, as the number of FUR regions 41 is larger, the breakdown voltage of the top face of the semiconductor substrate 11 improves, and as the number of diffusion regions 37 is larger, the breakdown voltage inside the semiconductor substrate 11 improves. Hereby, according to the configuration, it is possible to attain a relatively high breakdown voltage on the top face of the semiconductor substrate 11 as compared with the breakdown voltage inside the semiconductor substrate 11, in the termination region 14.

Figure 3:
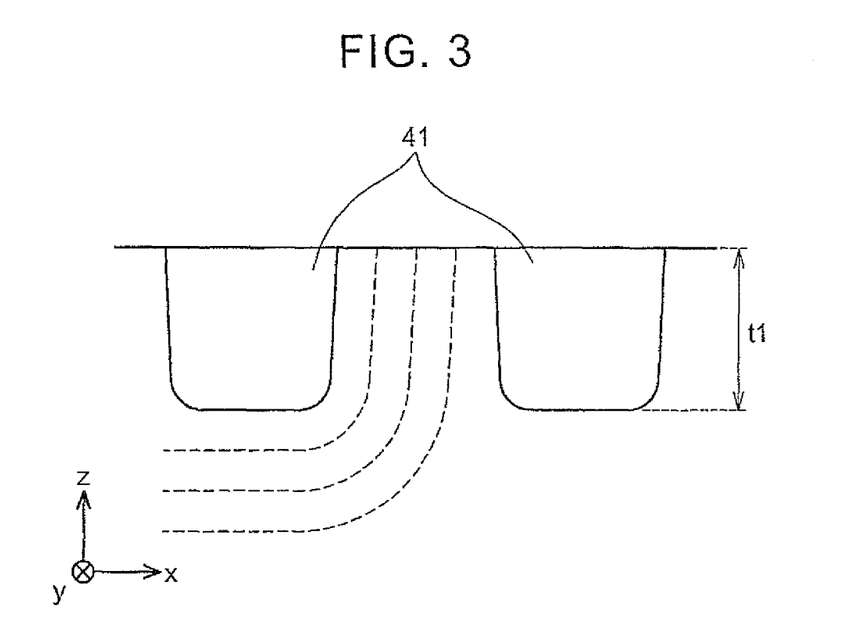
FIG. 3 is an enlarged view of FLR regions formed in a semiconductor substrate of Embodiment 1 of the present invention.
Figure 4:
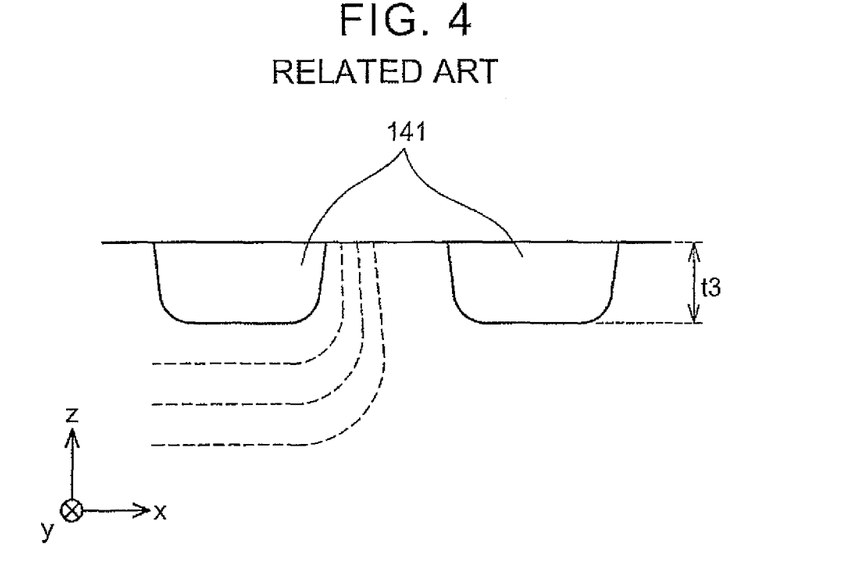
FIG. 4 illustrates a comparative example of FIG. 3, and is an enlarged view of FLR regions of a related art.

Further, in the present embodiment, the thickness t1 of the FLR region 41 in the z-direction is larger than the thickness t2 of the diffusion region 37 in the same direction. Advantages of this configuration are described below with reference to FIGS. 3, 4. The thickness t1 of the FLR region 41 in the z-direction in FIG. 3 is larger than a thickness t3 of a FLR region 141 in the z-direction in FIG. 4. Accordingly, a length of a side surface of the FLR region 41 is longer than a length of a side surface of the FLR region 141. Generally, a depletion layer expands in a pn junction so that fixed charge of a p-type region becomes equal to fixed charge of an n-type region. In view of this, in a case where respective depletion layers expand from a side surface of an FUR region and from a corner of the FLR region (that is, fixed charge equivalent to the fixed charge in the p-type region is secured in the n type region), when thicknesses of the respective depletion layers in their respective expanding directions are compared with each other, the depletion layer expanding from the side surface of the FLR region is thicker than the depletion layer expanding from the corner. In view of this, the depletion layer expands more easily from the FLR region 41 having a longer side-surface length than from the FLR region 141. Accordingly, equipotential lines are placed more evenly between adjacent FLR regions 41 than between adjacent FLR regions 141 (in other words, the equipotential lines are placed thinly). As a result, the FLR regions 41 can more reduce the electric field intensity on the top face of the semiconductor substrate 11, as compared with the FLR regions 141. Particularly, in the present embodiment, the thickness t1 of the FLR region 41 is set larger than the thickness t2 of the diffusion region 37. In view of this, a speed at which the depletion layer expands from the FLR region 41 is faster than a speed at which the depletion layer expands from the diffusion region 37. Accordingly, the depletion between the FLR regions 41 is faster than the depletion between the diffusion regions 37. As a result, it is possible to attain a relatively high breakdown voltage on the top face of the semiconductor substrate 11 as compared with the breakdown voltage inside the semiconductor substrate 11, in the termination region 14.

Further, in the present embodiment, the width w1 of the FLR region 41 in the x-direction is set larger than the width w2 of the diffusion region 37 in the same direction. Because of this, a curvature of the corner of the FLR region 41 is smaller than a curvature of the diffusion region 37 having a generally oval section (that is, a curvature radius of the corner of the FLR region 41 is larger than a curvature radius of the diffusion region 37). In view of this, the depletion layer expands relatively easily from the FLR region 41 as compared with the diffusion region 37. Accordingly, the depletion between the FLR regions 41 precedes the depletion between the diffusion regions 37. As a result, it is possible to attain a relatively high breakdown voltage on the top face of the semiconductor substrate 11 as compared with the breakdown voltage inside the semiconductor substrate 11, in the termination region 14.

The embodiment of the present invention has been described above in detail, but this is only an example, and the semiconductor device of the present invention includes embodiments obtained by variously modifying or changing the above embodiment.

For example, the bottom end of the gate trench 24 may be made shallow and the bottom portion of the gate trench 24 may be separated from the diffusion region 34 by the drift region 32a. Similarly, the bottom end of the dummy trench 25 may be made shallow and the bottom portion of the dummy trench 25 may be separated from the diffusion region 37a by the drift region 32b. Even with this configuration, it is possible to yield the same effect as in Embodiment 1.

Further, a relationship between the number of FLR regions 41 and the number of diffusion regions 37 (the diffusion regions 37c to 37f placed on the outer peripheral side of the boundary region 14a), a relationship between the thickness t1 of the FLR region 41 and the thickness t2 of the diffusion region 37, and a relationship between the width w1 of the FLR region 41 and the width w2 of the diffusion region 37 each yield the effect independently. In view of this, these three relationships should not be satisfied at the same time, but any one or two relationships may be employed.

Further, the number of diffusion regions 37 placed in the boundary region 14a may be one, or three or more. Further, it is not necessary for the diffusion region 37 to be entirely placed below the body region 36b, but the diffusion region 37 may be partially placed below the body region 36b when the semiconductor substrate 11 is viewed in a plane manner.

Further, the number of diffusion regions 37 and the number of FLR regions 41 are not limited to six. As more diffusion regions 37 and more FLR regions 41 are formed, it is possible to increase the breakdown voltage of the termination region 14. By adjusting respective intervals between the FLR regions 41 and between the diffusion regions 37 and the numbers thereof according to that desired value of the breakdown voltage in the termination region 14 which is desired to be maintained, it is possible to attain a relatively high breakdown voltage of the termination region 14 as compared with the breakdown voltage of the element region 12.

Further, in a case where the breakdown voltage can be maintained without forming the dummy trench 25, the dummy trench 25 may not be formed. Alternatively, two or more dummy trenches 25 may be formed. An electric conductor may be further formed inside the dummy trench 25. Further, two or more element regions 12 may be formed in the semiconductor substrate 11. Further, the present invention is not limited to an MOS, and can be applied to general high-power switching elements including an IGBT.

The concrete examples of the present invention have been described in detail, but these are merely examples. The present invention includes embodiments obtained by variously modifying or altering the concrete examples exemplified as above.

What is claimed is:

1. A semiconductor device comprising
a semiconductor substrate having an element region and a termination region surrounding the element region, wherein:
the element region includes
a first body region having a first conductivity type and being placed in a range facing a top face of the semiconductor substrate,
a first drift region having a second conductivity type and making contact with a bottom face of the first body region, the second conductivity type being different from the first conductivity type, and
a plurality of first floating regions, each of the first floating regions having the first conductivity type and being surrounded by the first drift region;
the termination region includes
a plurality of field limiting ring regions, each of the field limiting ring regions having the first conductivity type, being placed in a range facing the top face of the semiconductor substrate and surrounding an outer periphery of the element region,
a second drift region having the second conductivity type, making contact with the field limiting ring regions and surrounding the field limiting ring regions, and
a plurality of second floating regions, each of the second floating regions having the first conductivity type and being surrounded by the second drift region;
the second floating regions surround the outer periphery of the element region; and
at least one of the second floating regions is placed at an element region side relative to an inner peripheral side surface of one of the field limiting ring regions, the one of the field limiting ring regions being the closest of the field limiting ring regions to the element region.

2. The semiconductor device according to claim 1, wherein:
the termination region further includes a second body region;
the second body region has the first conductivity type, is placed in a range facing the top face of the semiconductor substrate, is partially disposed at an element-region side, and is continuously formed from the first body region;
the field limiting ring regions are arranged apart from the second body region;
the second drift region makes contact with a bottom face and side faces of the second body region;
the second drift region is configured to separate the second body region from the field limiting ring regions; and
when the semiconductor substrate is viewed in a plane manner, the second floating regions include at least one lower second floating region, the lower second floating region including an overlapping portion with the second body region.

3. The semiconductor device according to claim 2, wherein:
the second floating regions include a plurality of the lower second floating regions;

the first floating regions are placed at a predetermined interval from an element-region side toward a termination-region side in a predetermined depth in a thickness direction of the semiconductor substrate;

the lower second floating regions are placed in the predetermined depth;

an interval b0 between an outermost lower second floating region of the lower second floating regions and the closest one of the second floating regions to the outermost lower second floating region is a half or less of the predetermined interval; and the closest one of the second floating regions is arranged outside the outermost lower second floating region in a surface direction of the semiconductor device.

4. The semiconductor device according to claim 3, wherein:

n pieces of the field limiting ring regions are formed;

m pieces of the second floating regions are formed excluding the lower second floating regions;

n and m are natural numbers; and a following relationship (I) is established:

$$c0<b0, ci<bj \qquad (I),$$

where i is at least 1 and at most n−1, j is at least 1 and at most m −1, i is equal to j in the relationship (I), an upper limit of i is a smaller one of n−1 and m−1 in the relationship (I), ci indicates an interval between an i-th field limiting ring region and an (i+1)-th field limiting ring region from inside toward outside in the surface direction, c0 indicates an interval between a first field limiting ring region from inside in the surface direction and the second body region, and bj indicates an interval between a j-th second floating region and a (j+1)-th second floating region when the m pieces of the second floating regions are counted from inside toward outside in the surface direction.

5. The semiconductor device according to claim 3, wherein the number of the field limiting ring regions is larger than the number of the second floating regions excluding the lower second floating regions.

6. The semiconductor device according to claim 1, wherein:

the termination region further includes a second body region;

the second body region has the first conductivity type, is placed in a range facing the top face of the semiconductor substrate, is partially disposed at an element-region side, and is continuously formed from the first body region;

the field limiting ring regions are arranged apart from the second body region;

the second drift region makes contact with a bottom face and side faces of the second body region;

the second drift region is configured to separate the second body region from the field limiting ring regions; and when the semiconductor substrate is viewed in a plane manner, the second floating regions include one lower second floating region, the lower second floating region including an overlapping portion with the second body region;

the first floating regions are placed at a predetermined interval from an element-region side toward a termination-region side in a predetermined depth in a thickness direction of the semiconductor substrate;

the lower second floating region is placed in the predetermined depth;

an interval b0 between the lower second floating region and the closest one of the second floating regions to the lower second floating region is a half or less of the predetermined interval; and the closest one of the second floating regions is arranged outside the lower second floating region in a surface direction of the semiconductor device.

7. The semiconductor device according to claim 6, wherein:

n pieces of the field limiting ring regions are formed;

m pieces of the second floating regions are formed excluding the lower second floating region;

n and m are natural numbers; and a following relationship (I) is established:

$$c0<b0, ci<bj \qquad (I),$$

where i is at least 1 and at most n−1, j is at least 1 and at most m−1, i is equal to j in the relationship (I), an upper limit of i is a smaller one of n−1 and m−1 in the relationship (I), ci indicates an interval between an i-th field limiting ring region and an (i+1)-th field limiting ring region from inside toward outside in the surface direction, c0 indicates an interval between a first field limiting ring region from inside in the surface direction and the second body region, and bj indicates an interval between a j-th second floating region and a (j+1)-th second floating region when the m pieces of the second floating regions are counted from inside toward outside in the surface direction.

8. The semiconductor device according to claim 6, wherein the number of the field limiting ring regions is larger than the number of the second floating regions excluding the lower second floating region.

9. The semiconductor device according to claim 1, wherein:

a thickness of the field limiting ring region in a thickness direction of the semiconductor substrate is larger than a thickness of the second floating region in the thickness direction.

10. The semiconductor device according to claim 1, wherein:

when the semiconductor substrate is viewed in a plane manner, the termination region is formed between at least one side of the element region and an end side of the semiconductor substrate; and a width of the field limiting ring region in a specific direction from the element region toward the end side of the semiconductor substrate is larger than a width of the second floating region in the specific direction, between the at least one side of the element region and the end side of the semiconductor substrate.

11. The semiconductor device according to claim 1, wherein:

the element region includes a gate electrode and an insulator;

the gate electrode is placed inside a gate trench and is opposed to the first body region;

the gate trench penetrates through the first body region and extends to the first drift region;

the insulator is placed between the gate electrode and an inner wall of the gate trench, and the first floating region in the element region surrounds a bottom portion of the gate trench.

12. The semiconductor device according to claim 2, wherein:
- the termination region includes a dummy trench and an insulator;
- the dummy trench penetrates through the second body region and extends in the second drift region;
- the insulator is placed in the dummy trench;
- the dummy trench surrounds the outer periphery of the element region; and
- at least one of the second floating regions surrounds a bottom portion of the dummy trench.

* * * * *